United States Patent
Hosoi et al.

(10) Patent No.: US 7,978,047 B2
(45) Date of Patent: Jul. 12, 2011

(54) VARIABLE RESISTOR ELEMENT AND ITS MANUFACTURING METHOD

(75) Inventors: Yasunari Hosoi, Fukuyama (JP); Shigeo Ohnishi, Fukuyama (JP); Yasushi Ogimoto, Hihashi-yamato (JP); Takashi Oka, Taito-ku (JP); Naoto Nagaosa, Shinjyuku-ku (JP); Yoshinori Tokura, Nerima-ku (JP)

(73) Assignees: Sharp Kabushiki Kaisha, Osaka (JP); National Science and Technology, Tokyo (JP)

( * ) Notice: Subject to any disclaimer, the term of this patent is extended or adjusted under 35 U.S.C. 154(b) by 696 days.

(21) Appl. No.: 11/990,774

(22) PCT Filed: Aug. 8, 2006

(86) PCT No.: PCT/JP2006/315649
§ 371 (c)(1),
(2), (4) Date: Feb. 21, 2008

(87) PCT Pub. No.: WO2007/026509
PCT Pub. Date: Mar. 8, 2007

(65) Prior Publication Data
US 2009/0231083 A1 Sep. 17, 2009

(30) Foreign Application Priority Data
Aug. 29, 2005 (JP) .................................. 2005-247071

(51) Int. Cl.
*H01C 7/10* (2006.01)
(52) U.S. Cl. ......................................... 338/20; 365/148
(58) Field of Classification Search .................... 338/20; 365/148, 158
See application file for complete search history.

(56) References Cited

U.S. PATENT DOCUMENTS

| 6,204,139 B1 | 3/2001 | Liu et al. |
| 2004/0121074 A1 | 6/2004 | Zhuang et al. |
| 2005/0151156 A1* | 7/2005 | Wu et al. ...................... 257/107 |

FOREIGN PATENT DOCUMENTS

| JP | 2004-204348 | 7/2004 |
| JP | 2006-120701 | 5/2006 |

(Continued)

OTHER PUBLICATIONS

International Search Report for PCT/JP2006/315649 mailed Oct. 3, 2006.

(Continued)

*Primary Examiner* — Kyung Lee
(74) *Attorney, Agent, or Firm* — Nixon & Vanderhye P.C.

(57) ABSTRACT

A variable resistance element comprises a variable resistor of strongly-correlated material sandwiched between two metal electrodes, and the electric resistance between the metal electrodes varies when a voltage pulse is applied between the metal electrodes. Such a switching operation as the ratio of electric resistance between low and high resistance states is high can be attained by designing the metal electrodes and variable resistor appropriately based on a definite switching operation principle. Material and composition of the first electrode and variable resistor are set such that metal insulator transition takes place on the interface of the first electrode in any one of two metal electrodes and the variable resistor by applying a voltage pulse. Two-phase coexisting phase of metal and insulator phases can be formed in the vicinity of the interface between the variable resistor and first electrode by the work function difference between the first electrode and variable resistor.

31 Claims, 13 Drawing Sheets

FOREIGN PATENT DOCUMENTS

JP  2006-196566  7/2006

OTHER PUBLICATIONS

Sawa et al., "Hysteric current-voltage characteristic and resistance switching at a rectifying Ti/Pr0.7Ca0.3MnO3 interface" *Applied Physics Letter*, vol. 85, No. 18, Nov. 2004, pp. 4073-4075.

Zhuang et al., Novell Colossal Magnetoresistive Thin Film Nonvolatile Resistance Random Access Memory (RRAM).

Kotliar et al., "Compressibility Divergence and the Finite Temperature Mott Transition", *Physical Review Letters*, vol. 89, No. 4, Jul. 2002, pp. 1-4.

Imada et al., "Metal-insulator transitions", *Reviews of Modern Physics*, vol. 70, No. 4, Oct. 1998, pp. 1143-1263.

Dearnley et al., "Electrical phenomena in amorphous oxide films", *Rep. Prog. Phys.*, 1970, pp. 1129-1191.

\* cited by examiner

VARIABLE RESISTOR ELEMENT AND ITS MANUFACTURING METHOD

CROSS-REFERENCE TO RELATED APPLICATIONS

This application is a National Phase filing under 35 U.S.C. §371 of International Application No. PCT/JP2006/315649 filed on Aug. 8, 2006, and which claims priority to Japanese Patent Application No. 2005-247071 filed on Aug. 29, 2005.

TECHNICAL FIELD

The present invention relates to a variable resistor element provided with a variable resistor sandwiched between two metal electrodes and changing an electric resistance between the metal electrodes when a voltage pulse is applied between the metal electrodes, and its manufacturing method.

BACKGROUND ART

Recently, as a next-generation NVRAM (Nonvolatile Random Access Memory) capable of operating at high speed to replace a flash memory, various kinds of device structures such as a FeRAM (Ferroelectric RAM), a MRAM (Magnetic RAM), an OUM (Ovonic Unified Memory) are proposed and a fierce development race is carried on in terms of implement high performance, high reliability, low cost, and process compatibility. However, each above memory device has good and bad points and it is far from an ideal "universal memory" having good points of a SRAM, a DRAM and a flash memory.

With respect to these existing techniques, a RRAM (Resistance Control Random Access Memory) comprising a variable resistor element in which an electric resistance is reversibly changed when a voltage pulse is applied has been proposed. The variable resistor element has an extremely simple laminated structure in which a variable resistor 2 is provided between two metal electrodes of an upper electrode 1 and a lower electrode 3 as shown in FIG. 1, and a resistance value between both electrodes can be reversibly changed by applying a voltage pulse between the upper electrode 1 and the lower electrode 3. A new nonvolatile memory device can be implemented by reading a resistance value in the reversible resistance changing operation (referred to as the "switching operation" occasionally hereinafter).

A method of changing an electric resistance reversibly by applying a voltage pulse to a perovskite material known for its colossal magnetoresistance (CMR) effect as a material of the variable resistor is disclosed in the following patent document 1 and non-patent document 1 by Shangquing Liu and Alex Ignatiev et al. in U.S. Houston University. This is an extremely epoch-making method in which while the perovskite material known for its colossal magnetoresistance effect is used, a resistance change over several digits can be provided at room temperature without applying a magnetic field. In addition, according to an element structure disclosed in the patent document 1, a crystalline praseodymium calcium manganese oxide $Pr_{1-z}Ca_zMnO_3$ (referred to as the PCMO occasionally hereinafter) film that is a perovskite-type oxide is used as a material of the variable resistor. In addition, the fact that the switching operation can be provided in a binary transition metal oxide other than the perovskite material is disclosed in non-patent document 5.

As for now, although the switching operation principle of the variable resistor element is not clarified, the fact that a memory having a large resistance ratio can be implemented by forming a Schottky barrier between the electrode and the variable resistor is disclosed in the following non-patent document 2 by Sawa et al. in National Institute of Advanced Industrial Science and Technology.

Patent document 1: U.S. Pat. No. 6,204,139
Non-patent document 1: Zhuang, H. H. et al., "Novel Colossal Random Access Memory (RRAM)", IEDM, Article No. 7.5, December 2002
Non-patent document 2: A. Sawa et al., "Hysteretic current-voltage characteristic and resistance switching at a rectifying n/Pr0.7Ca0.3MnO3 interface", Applied Physics Letter, vol. 85 pp. 4073 to 4075, November 2004
Non-patent document 3: M. Imada et. al., "Metal-Insulator Transition", Review of Moderan Physics 70, pp. 1039 to 1247, 1998, especially in Chapter 4 (pp. 1144 to 1245)
Non-patent document 4: G. Kotliar et al., "Compressibility Divergence and the Finite Temperature Mott Transition", Physical Review Letters, Vol. 89, No. 4, pp. 046401-1 to 046401-4, 2002
Non-patent document 5: G. Dearnaley et al., "Electrical Phenomena in Amorphous Oxide Films", Reports on Progress in Physics 33, pp. 1129 to 1191, September, 1970

However, in the resistance change random access memory proposed by the conventional invention and document, the principle of the switching operation has not yet clarified, and a control indicator of a process parameter to design the device has not clarified.

The present invention was made in view of the above problems and it is an object of the present invention to provide a variable resistor element provided with a variable resistor formed of a strongly-correlated material between two metal electrodes and changing an electric resistance between the metal electrodes when a voltage pulse is applied between the metal electrodes, in which a switching operation having a large resistance ratio between a low resistance state and a high resistance state of the electric resistance can be implemented by appropriately designing the metal electrode and the variable resistor based on a clear switching operation principle.

SUMMARY OF THE INVENTION

A variable resistor element according to an embodiment of the present invention comprises a variable resistor formed of a strongly-correlated material between two metal electrodes and changes in electric resistance between the metal electrodes when a voltage pulse is applied between the metal electrodes, and it is characterized in that metal-insulator transition is caused at an interface between a first electrode that is either one of the two metal electrodes and the variable resistor when the voltage pulse is applied.

In addition, the variable resistor element having the above characteristics is characterized in that a work function difference between the first electrode and the variable resistor is a work function difference capable of forming a two-phase coexisting phase of a metal phase and an insulator phase in the vicinity of the interface between the variable resistor and the first electrode.

Furthermore, the variable resistor element having the above characteristics is characterized in that the metal-insulator transition is Mott transition.

Still furthermore, the variable resistor element having the above characteristics is characterized in that the variable resistor is a perovskite-type oxide.

Still furthermore, the variable resistor element having the above characteristics is characterized in that the variable resistor is a perovskite-type oxide of a p-type semiconductor or an n-type semiconductor expressed by a general formula $(RE_{1-z}AE_z)_{n+1}B_nO_{3n+1}$ (wherein, n=1, 2 or ∞ and doping rate "z" satisfies $0 \leq z \leq 1$), or a solid solution of a p-type semiconductor or an n-type semiconductor comprising a combination of a plurality of different perovskite-type oxides expressed by the above general formula, "RE" in the general formula is any one rare earth element selected from La, Pr, Nd, Sm, Eu, Gd, Tb, Dy, Ho, Er, Tm, Yb, and Lu, "AE" in the general formula is any one alkaline earth element selected from Ca, Sr, and Ba, and "B" in the general formula is any one element selected from Sc, Ti, V, Cr, Mn, Fe, Co, Ni, and Cu.

Still furthermore, the variable resistor element having the above characteristics is characterized in that the variable resistor is a transition metal oxide or lanthanoid metal oxide.

Still furthermore, the variable resistor element having the above characteristics is characterized in that the variable resistor is a metal oxide of a p-type semiconductor expressed by a general formula $M_{m(1-z)}O_n$ (wherein "m" and "n" are stoichiometric compositions determined by a valence of metal (M) ion and "z" is a carrier concentration per unit cell due to introduction of excessive oxygen within a range of $0<z<1$) or an n-type semiconductor expressed by a general formula $M_mO_{n(1-z)}$ ("m" and "n" are stoichiometric compositions determined by a valence of metal (M) ion and "z" is a carrier concentration per unit cell due to the introduction of oxygen defect within a range of $0<z<1$), and "M" in the general formula is any one element selected from transition metal having 3d-electron, 4d-electron or 5d-electron and lanthanoid metal having 4f-electron.

Still furthermore, the variable resistor element having the above characteristics is characterized in that the variable resistor is a metal oxide expressed by $(M_{1-z}N_z)_mO_n$ (wherein "m" and "n" are stoichiometric compositions determined by a valence of metal (M) ion and "z" is a doping amount of metal N (wherein "N" is alkaline metal, alkaline earth metal, transition metal, or lanthanoid metal) having a valence different from that of the metal "M" within a range of $0 \leq z \leq 1$), and "M" in the general formula is any one element selected from transition metal having 3d-electron, 4d-electron or 5d-electron and lanthanoid metal having 4f-electron.

Still furthermore, the variable resistor element having the above characteristics is characterized in that a potential difference Vd defined by a work function difference between the first electrode and the variable resistor of the p-type semiconductor satisfies the following inequality $$Vd < -z(W-\Delta)/2$$

wherein a doping rate of the variable resistor is "z", a band width of the variable resistor is "W", and Mott gap of the variable resistor is "$\Delta$".

Still furthermore, the variable resistor element having the above characteristics is characterized in that a potential difference Vd defined by a work function difference between the first electrode and the variable resistor of the n-type semiconductor satisfies the following inequality $$Vd > z(W-\Delta)/2$$

wherein a doping rate of the variable resistor is "z", a band width of the variable resistor is "W", and Mott gap of the variable resistor is "$\Delta$".

Furthermore, an example manufacturing method of a variable resistor element according to the present invention is a manufacturing method of a variable resistor element provided with a variable resistor formed of a strongly-correlated material between two metal electrodes and it is characterized in that the variable resistor element has characteristics such that, when a voltage pulse is applied between the metal electrodes, metal-insulator transition generates at an interface between a first electrode that is either one of the two metal electrodes and the variable resistor, and an electric resistance between the metal electrodes changes, and a material and a composition of the first electrode and a material and a composition of the variable resistor are set so that a work function difference between the first electrode and the variable resistor becomes a work function difference capable of forming a two-phase coexisting phase between a metal phase and an insulator phase in the vicinity of the interface between the variable resistor and the first electrode.

Still furthermore, the manufacturing method of the variable resistor element having the above characteristics is characterized in that the variable resistor is a perovskite-type oxide.

Still furthermore, the manufacturing method of the variable resistor element having the above characteristics is characterized in that the variable resistor is a perovskite-type oxide of a p-type semiconductor or an n-type semiconductor expressed by a general formula $(RE_{1-z}AE_z)_{n+1}B_nO_{3n+1}$ (wherein $n=1, 2$ or $\infty$, and doping rate "z" satisfies $0 \leq z \leq 1$), or a solid solution of a p-type semiconductor or an n-type semiconductor comprising a combination of a plurality of different perovskite-type oxides expressed by the above general formula, "RE" in the general formula is any one rare earth element selected from La, Pr, Nd, Sm, Eu, Gd, Tb, Dy, Ho, Er, Tm, Yb, and Lu, "AE" in the general formula is any one alkaline earth element selected from Ca, Sr, and Ba, and "B" in the general formula is any one element selected from Sc, n, V, Cr, Mn, Fe, Co, Ni, and Cu.

Still furthermore, the manufacturing method of the variable resistor element having the above characteristics is characterized in that the variable resistor is a transition metal oxide or lanthanoid metal oxide.

Still furthermore, the manufacturing method of the variable resistor element having the above characteristics is characterized in that the variable resistor is a metal oxide of a p-type semiconductor expressed by a general formula $M_{m(1-z)}O_n$ (wherein "m" and "n" are stoichiometric compositions determined by a valence of metal (M) ion and "z" is a carrier concentration per unit cell due to introduction of excessive oxygen within a range of $0<z<1$) or an n-type semiconductor expressed by a general formula $M_mO_{n(1-z)}$ (wherein "m" and "n" are stoichiometric compositions determined by a valence of metal (M) ion and "z" is a carrier concentration per unit cell due to introduction of oxygen defect within a range of $0<z<1$), and "M" in the general formula is any one element selected from transition metal having 3d-electron, 4d-electron or 5d-electron and lanthanoid metal having 4f-electron.

Still furthermore, the manufacturing method of the variable resistor element having the above characteristics is characterized in that the variable resistor is a metal oxide expressed by $(M_{1-1}N_z)_mO_n$ (wherein "m" and "n" are stoichiometric compositions determined by a valence of metal (M) ion and "z" is a doping amount of metal N (wherein "N" is alkaline metal, alkaline earth metal, transition metal, or lanthanoid metal) having a valence different from that of the metal M within a range of $0 \leq z \leq 1$), and "M" in the general formula is any one element selected from transition metal having 3d-electron, 4d-electron or 5d-electron and lanthanoid metal having 4f-electron.

Still furthermore, the manufacturing method of the variable resistor element having the above characteristics is characterized in that a material and a composition of the first electrode and a material and a composition of the variable resistor are set so that a potential difference Vd defined by a work function difference between the first electrode and the variable resistor of the p-type semiconductor satisfies the following inequality $$Vd<-z(W-\Delta)/2$$

wherein a doping rate of the variable resistor is "z", a band width of the variable resistor is "W", and Mott gap of the variable resistor is "Δ".

Still furthermore, the manufacturing method of the variable resistor element having the above characteristics is characterized in that a material and a composition of the first electrode and a material and a composition of the variable resistor are set so that a potential difference Vd defined by a work function difference between the first electrode and the variable resistor of the n-type semiconductor satisfies the following inequality $$Vd>z(W-\Delta)/2$$

wherein a doping rate of the variable resistor is "z", a band width of the variable resistor is "W", and Mott gap of the variable resistor is "Δ".

According to the variable resistor element having the above characteristics or the manufacturing method of the variable resistor element having the above characteristics, since the switching operation principle by the metal-insulator transition (Mott transition) at the interface between a first electrode that is either one of the two metal electrodes and the variable resistor is theoretically shown, a material design condition to provide the appropriate switching operation becomes clear, so that the variable resistor element can implement the switching operation having a large resistance ratio between the low resistance state and the high resistance state of the electric resistance.

Especially, when the material and composition of the first electrode and the material and the composition of the variable resistor are set so that the potential difference Vd defined by the work function difference between the first electrode and the variable resistor in the case of the p-type semiconductor satisfies the following inequality $$Vd<-z(W-\Delta)/2$$

and, in the case of the n-type semiconductor, satisfies the following inequality $$Vd>z(W-\Delta)/2$$

wherein a doping rate of the variable resistor is "z", a band width of the variable resistor is "W", and Mott gap of the variable resistor is Δ, the specific material design condition becomes clear and the variable resistor element can provide more precise switching operation characteristics.

EXPLANATION OF REFERENCES

Figure 1:
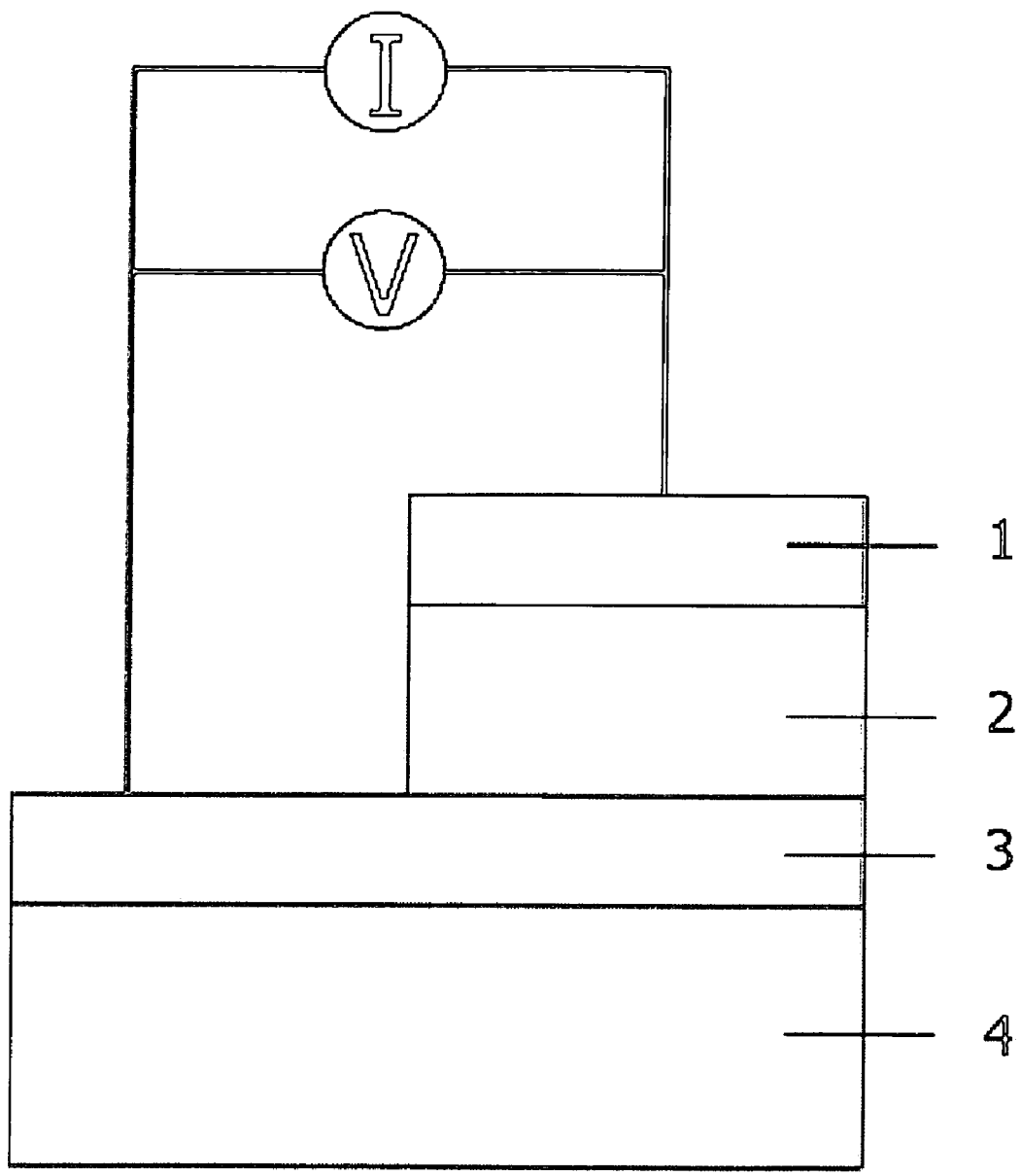
FIG. 1 is an element sectional view schematically showing a sectional structure of a variable resistor element according to the present invention in a first embodiment using a strongly-correlated material of a p-type semiconductor as a variable resistor.

1: Upper electrode
2: Strongly-correlated material of p-type semiconductor (variable resistor)
3: Lower electrode
4: Substrate
5: Strongly-correlated material of n-type semiconductor (variable resistor)
W: Band width of variable resistor
Δ: Mott gap of variable resistor
$d_{MI}$: Thickness of Mott insulator phase

DETAILED DESCRIPTION OF THE INVENTION

Embodiments of a variable resistor element and its manufacturing method according to the present invention (referred to as "the element of the present invention" and "the method of the present invention" occasionally hereinafter) will be described with reference to the drawings hereinafter. In addition, both element and method of the present invention are referred to as "the present invention" occasionally hereinafter.

The element of the present invention comprises a variable resistor formed of a strongly-correlated material between two metal electrodes, and its electric resistance between the metal electrodes is changed when a voltage pulse is applied between the metal electrodes. In addition, the method of the present invention is a manufacturing method of the variable resistor element.

The inventors of this application have clarified theoretically through keen examinations for the first time that when a voltage is applied to the interface between the metal electrode and the strongly-correlated material, Mott transition occurs in the strongly-correlated material and the variable resistor element having the above element structure implements a resistance switching operation. Semantic contents of the element of the present invention and the method of the present invention are defined based on a theoretically clarified operation mechanism of the resistance switching operation. A description will be made of it hereinafter.

In addition, for reference, phase transition of the general strongly-correlated material is described in non-patent document 3 and non-patent document 4 as shown in the last part of the section of the background art, and the non-patent documents 3 and 4 are disclosed as the documents of the background art of this application.

Metal insulator transitions of various kinds of strongly-correlated materials are described in the non-patent document 3. The strongly-correlated material used in the element of the present invention is selected from a material group described in the last half of this non-patent document (chapter 4). In addition, in the chapter 4 in the non-patent document 3, the strongly-correlated material includes $V_2O_{3-y}$, $NiS_{2-x}Se_x$, $RNiO_3$, $NiS_{1-x}Se_x$, $Ca_{1-x}Sr_yVO_3$, $La_{1-x}Sr_xTiO_3$, $La_{2-x}Sr_xVO_3$, $La_{2-x}Sr_xCuO_4$, $Nd_{2-x}Ce_xCuO_4$, $YBa_2Cu_3O_{7-y}$, $Bi_2Sr_2Ca_{1-x}R_xCu_2O_{8+\delta}$, $La_{1-x}Sr_xCuO_{2.5}$, $Sr_{14-x}Ca_xCu_{24}O_{41}$, $BaVS_3$, $Fe_3O_4$, $La_{1-x}Sr_xFeO_3$, $La_{2-x-x}Sr_x NiO_{4+y}$, $La_{1-x}Sr_{1+x}MnO_4$, $La_{1-x}Sr_xMnO_3$, $La_{2-2x}Sr_{1+2x}Mn_2O_7$, $FeSi$, $VO_2$, $Ti_2O_3$, $LaCoO_3$, $La_{1.17-x}A_xVS_{3.17}$, $Sr_2RuO_4$, and $Ca_{1-x}Sr_xRuO_3$.

According to the non-patent document 4, hysteresis of potential dependency of an electron density in a metal insulator transition phenomenon seen in the strongly-correlated material is theoretically analyzed. Thus, this backs up theoretically the characteristics in first and second embodiments of the present invention shown in FIGS. 2 and 9.

First Embodiment

FIG. 1 is a sectional view showing a sectional structure of an element of the present invention according to a first embodiment. The element of the present invention is formed by sequentially depositing a lower electrode 3, a variable resistor 2 formed of a strongly-correlated material (strongly-correlated electron material) of a p-type semiconductor, and an upper electrode 1 on a substrate 4. The variable resistor 2 in a metal state is sandwiched between the electrodes 1 and 3 and it is operated by applying a voltage pulse between the electrodes. The switching operation between an ON state (low resistance state) and OFF state (high resistance state) is implemented by the voltage pulse having a voltage magnitude greater than that of an absolute value of a threshold voltage as will be described below, and the resistance state of the element of the present invention is read by applying a voltage lower than the threshold voltage to use the element as a memory element. To provide different electric resistances between the ON state and OFF state, it is necessary to select an electrode material having an appropriate work function, so that the performance of the switching operation varies depending on the combination between the electrode and the variable resistor. In addition, reference characters "I" and "V" designate an ampere meter and a voltmeter used when the current/voltage characteristics of the element of the present invention are measured.

Figure 2:
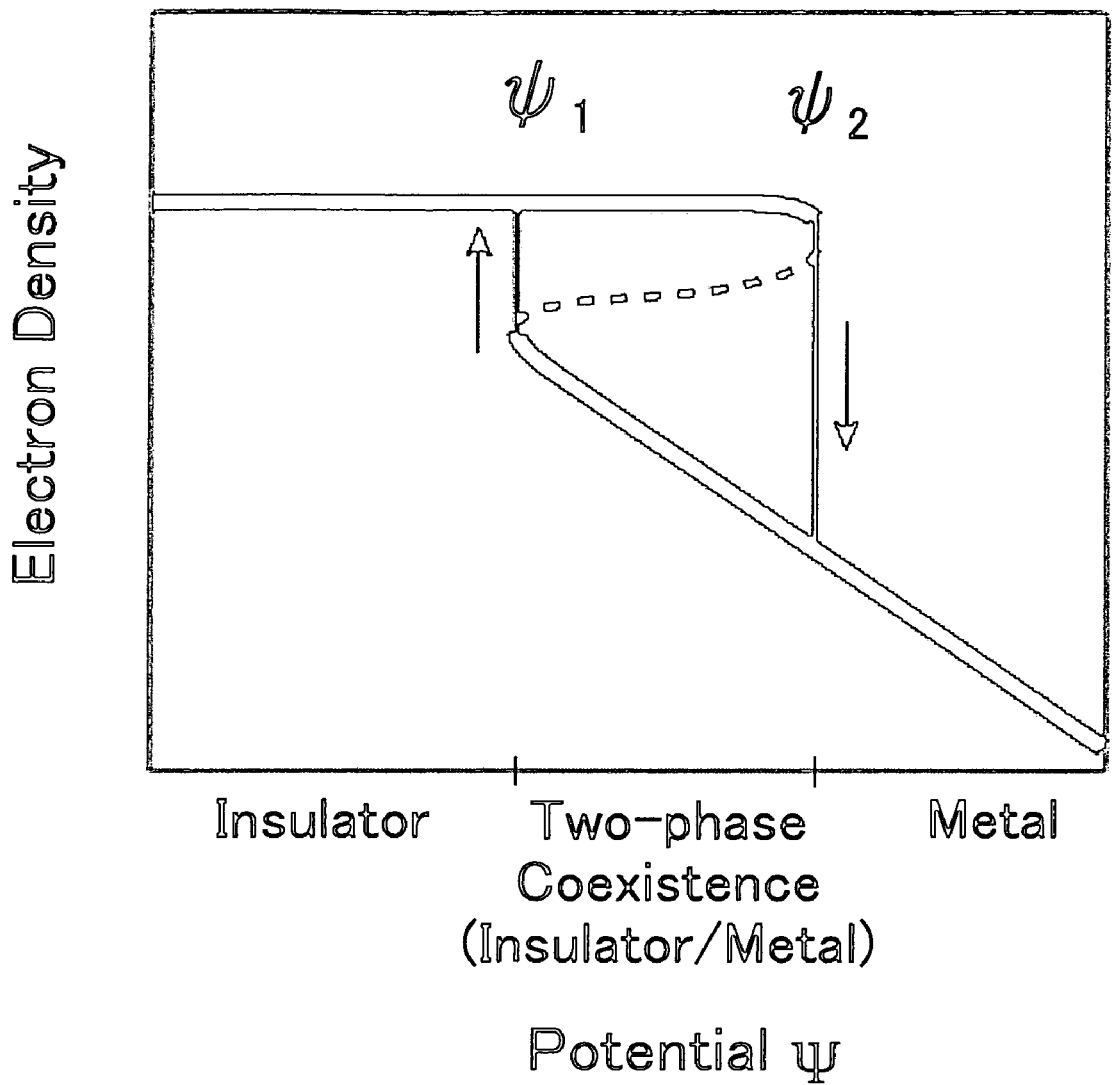
FIG. 2 is a view showing potential dependency of an electron density in the vicinity of metal-insulator transition point of the variable resistor in the first embodiment.

First, a switching operation principle will be described. As shown in a non-patent document 5, an electron density in the vicinity of the potential causing the metal insulator transition shows hysteresis with respect to a potential change as shown in FIG. 2. That is, as shown in FIG. 2, when a potential $\Psi$ is lowered from a metal state, the element is transferred to an insulator at a potential $\Psi 1$ while when the potential $\Psi$ is raised from the insulator state, it is transferred to the metal state at a potential $\Psi 2$. When the potential $\Psi$ is positioned between the phase transition points $\Psi 1$ and $\Psi 2$ ($\Psi 1 < \Psi < \Psi 2$), two-phase coexisting phase is provided so that the electron density can be in either of the metal state or the insulator state. When this two-phase coexisting phase is implemented in the variable resistor (strongly-correlated material) and the metal (ON state) and the insulator (OFF state) are switched, the element can be functioned as a variable resistor element that can be used in a resistive nonvolatile memory (RRAM).

Figure 3:
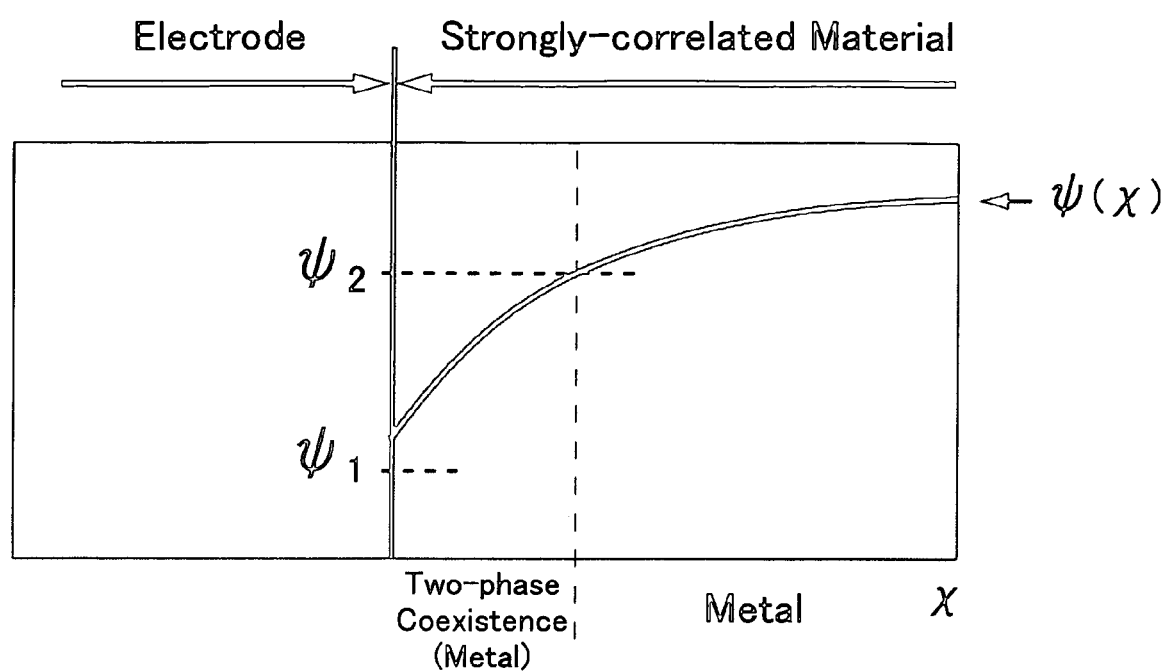
FIG. 3 is a view showing spatial dependency in the vicinity of an interface between a metal electrode and the strongly-correlated material when a two-phase coexisting phase of the variable resistor in the first embodiment is in a metal state.
Figure 4:
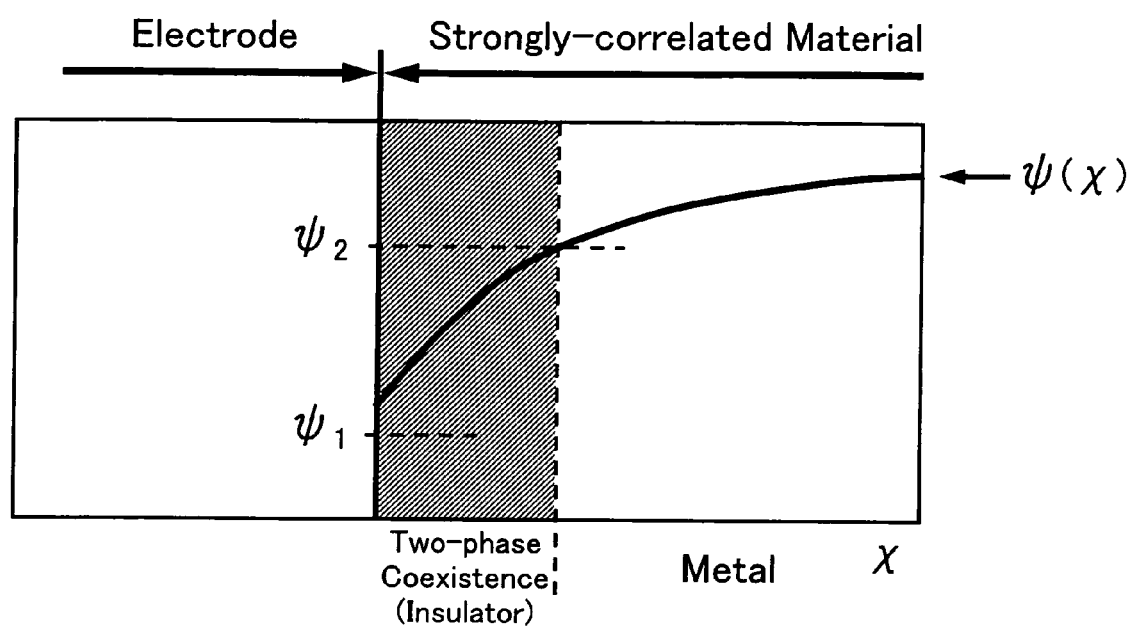
FIG. 4 is a view showing spatial dependency in the vicinity of the interface between the metal electrode and the strongly-correlated material when the two-phase coexisting phase of the variable resistor in the first embodiment is in an insulator state.

An important point in the present invention is a work function difference between either electrode material (first electrode) of the lower electrode or the upper electrode and the variable resistor, and the two-phase coexisting phase is to be implemented in the variable resistor by setting an appropriate work function. When it is assumed that the potential in the variable resistor is $\Psi(x)$ (wherein x is a distance from the interface with the first electrode), the $\Psi(x)$ is spatially modified due to a charge injection effect from the electrode metal. Accordingly, it is necessary to set a work function difference so as to satisfy $\Psi 1 < \Psi(0) < \Psi 2$ that is the condition for the $\Psi(x)$ to cross the phase transition point. At this time, since two phase transition points $\Psi 1$ and $\Psi 2$ exist on both sides of the two-phase coexisting phase, the thickness of the insulator phase in the variable resistor varies depending on which point is selected. FIG. 3 shows a device in the ON state in which the two-phase coexisting phase is in the metal state, and FIG. 4 shows a device in the OFF state in which the two-phase coexisting phase is in the insulator state. When the insulator phase at the interface between the electrode and the strongly-correlated material is thick, the resistance becomes high, so the current-voltage characteristics in FIG. 3 are different from those in FIG. 4 in which two different insulator phase thicknesses are implemented.

Figure 5:
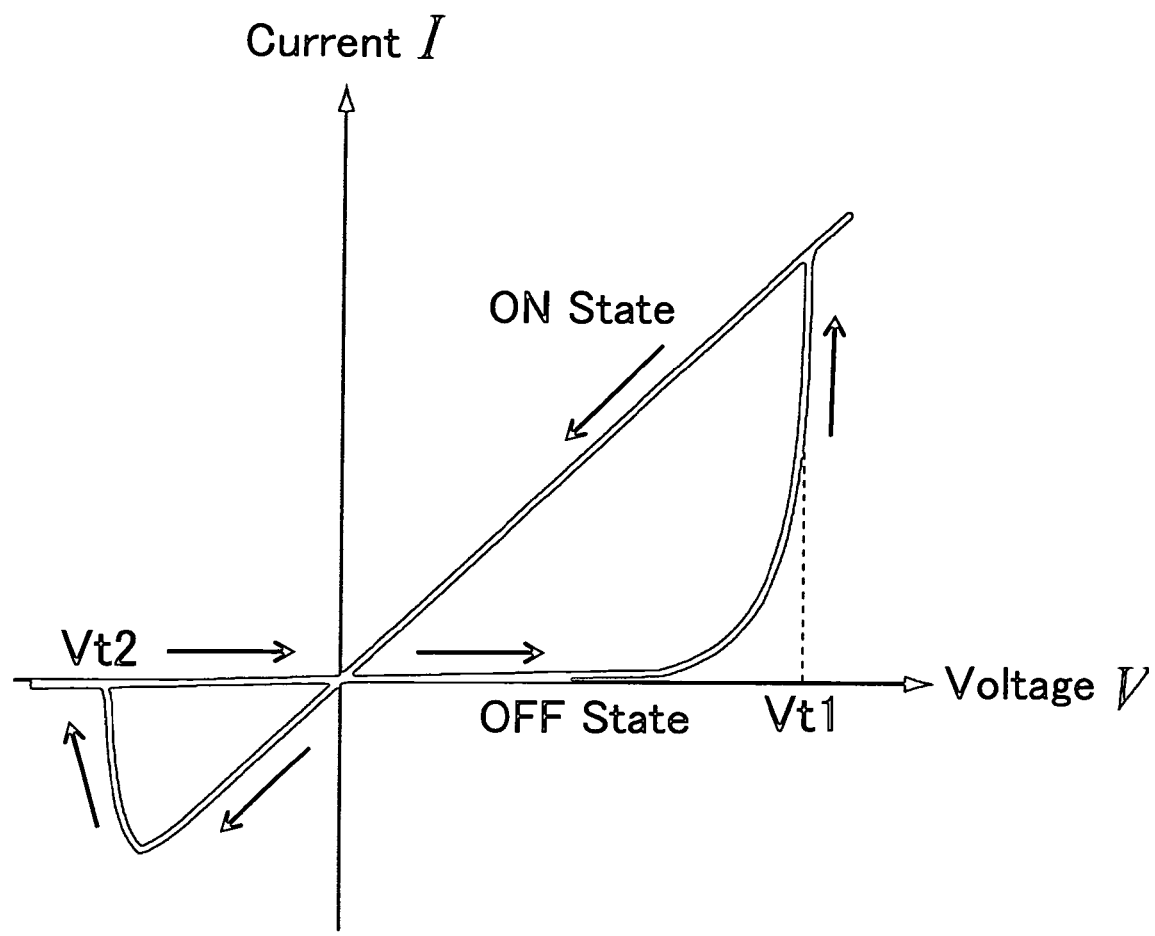
FIG. 5 is a current/voltage plot showing behavior of current/voltage characteristics in ON state and OFF state when an interface potential $\phi(0)$ between the metal electrode and the strongly-correlated material exists between transition points $\phi 1$ and $\phi 2$ in the first embodiment.

FIG. 5 shows behavior of the current-voltage characteristics in the ON state and OFF state of the element of the present invention. As shown in FIG. 5, when a positive voltage pulse having a voltage magnitude greater than an absolute value |Vt1| of the threshold voltage is applied to the element of the present invention in the OFF state, the state is shifted to the ON state, and when a negative voltage pulse having a voltage magnitude greater than an absolute value |Vt2| of the threshold voltage is applied to the element of the present invention in the ON state, the state is shifted to the OFF state.

Figure 6:
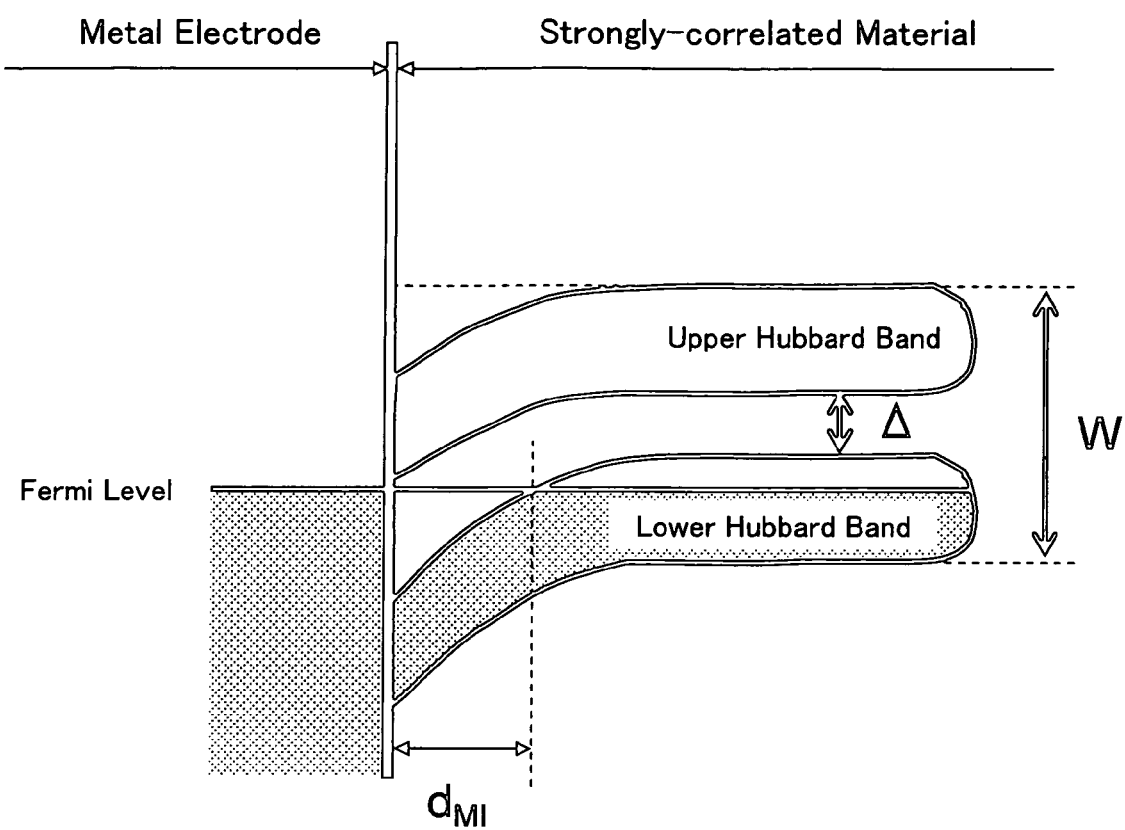
FIG. 6 is a potential conceptual view of the variable resistor element according to the present invention in the first embodiment using the strongly-correlated material of the p-type semiconductor as the variable resistor.

Next, the condition to implement the switching operation will be described. FIG. 6 is an energy band diagram showing a potential conceptual view at the interface between the metal electrode material and the strongly-correlated material in the element of the present invention. In addition, as the strongly-correlated material, a hole-doped p-type semiconductor is used. Mott metal-insulator transition phenomenon at the interface due to band bending was theoretically calculated using a density matrix renormalization group. The result can be explained by slightly expanding Poisson formula used in semiconductor hetero conjunction. Basically, forming the Mott insulator phase (two-phase coexisting phase) at the interface under zero-bias condition, that is, a condition that satisfies Mott insulator phase thickness $d_{MI}>0$ is required to explain the switching phenomenon.

Since the Mott insulator phase thickness dm is expressed by the following formula 1, if a potential difference Vd defined by a difference between the work function of the electrode material and the work function of the variable resistor (strongly-correlated material) satisfies, at least, the condition expressed by the following formula 2, the Mott insulator phase thickness $d_{MI}$ becomes a positive value (real number).

$$d_{MI}=(\in(-2Vd-z(W-\Delta))/(ez))^{1/2} \qquad \text{Formula 1}$$

$$Vd<-z(W-\Delta)/2 \qquad \text{Formula 2}$$

In the formula 1 and formula 2, "z" is a doping rate, "W" is a band width of the variable resistor (refer to FIG. 6), and "$\Delta$" is a Mott gap of the variable resistor (refer to FIG. 6). In addition, in the formula 1, "$\in$" is a dielectric constant of the variable resistor (Motto insulator phase) and "e" is an elementary charge. Here, the doping rate "z" actually corresponds to the number of conductive carriers per unit cell in the variable resistor. According to the first embodiment, since the variable resistor is the p-type semiconductor, the carrier is a hole. When a perovskite-type oxide that will be described below is used as the variable resistor, the variable resistor can be expressed by a general formula $(RE_{1-z}AE_z)_{n+1}B_nO_{3n+1}$ (wherein n=1, 2 or $\infty$, and doping rate "z" satisfies that $0 \leq z \leq 1$) assuming that the doping rate "z" is a composition ratio (mol fraction) of alkaline earth metal AE substituting rare earth metal RE in a A site of the perovskite-type oxide.

Therefore, specifically, the doping rate "z", "W" and "$\Delta$" can be led from composition analysis of the variable resistor, photoelectron spectroscopic measurement of the bulk of the variable resistor, and optical spectrum (optical conductivity) of the bulk of the variable resistor, respectively.

The strongly-correlated material is likely to be used as the insulator transition phase in the present invention. The following material is desirable.

As a preferable example of the strongly-correlated material of the variable resistor in this embodiment, a perovskite-type oxide of a p-type semiconductor expressed by the structural formula (general formula) of the following chemical formula 1, or a solid solution of a p-type semiconductor comprising a combination of a plurality of different perovskite-type oxides expressed by the above structural formula is used.

$$(RE_{1-z}AE_z)_{n+1}B_nO_{3n+1} \qquad \text{Chemical formula 1}$$

Here, in the above structural formula, n=1, 2 or $\infty$, and $0 \leq z \leq 1$. In addition, "RE" is any one rare earth element selected from La, Pr, Nd, Sm, Eu, Gd, Tb, Dy, Ho, Er, Tm, Yb, and Lu, "AE" is any one alkaline earth element selected from Ca, Sr, and Ba, and "B" is any one element selected from Sc, Cr, Mn, Fe, Co, Ni, and Cu.

Specifically, according to the structural formula shown in the chemical formula 1, when n=$\infty$, the formula is $(RE_{1-z}AE_z)BO_3$, when n=1, the formula is $(RE_{1-z}AE_z)_2BO_4$, and when n=2, the formula is $(RE_{1-z}AE_z)_3B_2O_7$.

The perovskite-type oxide is large in substitution range of the element due to its flexibility of structure, so that a large variety of doping can be implemented. Therefore, it has characteristics such that the band width (W) and the Mott gap ($\Delta$) serving as important parameters in determining the characteristics of the variable resistor element (threshold value, resistance value, resistance change ratio, and stability) can be easily and precisely controlled. Because, the material design can be implemented using the band width provided by an average ion radius of the RE and AE and the carrier amount provided by the doping rate "z" as the parameters.

Specifically, when Mn is selected as a B site element in the structural formula shown in the chemical formula 1, as a Mn oxide having the $(RE_{1-z}AE_z)BO_3$ structure when n=$\infty$, $La_{1-z}Ca_zMnO_3$, $Pr_{1-z}Ca_zMnO_3$, $Nd_{1-z}Ca_zMnO_3$, $Sm_{1-z}Ca_zMnO_3$, $Gd_{1-z}Ca_zMnO_3$, $La_{1-z}Sr_zMnO_3$, $Pr_{1-z}Sr_zMnO_3$, $Nd_{1-z}Sr_zMnO_3$, $Sm_{1-z}Sr_zMnO_3$, $Gd_{1-z}Sr_zMnO_3$ and the like are preferable. Furthermore, in the perovskite-type oxide, a material in which the RE ion and AE ion in the A site are ordered (here, referred to as the A site ordered perovskite-type oxide) is preferable because a charge-ordering temperature (or an orbit-ordering temperature or when they are the same, a charge/orbit ordering temperature) causing the metal insulator transition is sufficiently higher than room temperature. Specifically, the material is expressed by $REBaMn_2O_6$ (wherein "RE" corresponds to the above rare earth element).

In addition, as the Mn oxide having the $(RE_{1-z}AE_z)_2BO_4$ structure when n=1, $(La_{1-z}Sr_z)_2MnO_4$ is preferable. Furthermore, as the Mn oxide having the $(RE_{1-z}AE_z)_3B_2O_7$ structure when n=2, $(La_{1-z}Sr_z)_3Mn_2O_7$ is preferable.

Then, an example of the material comprising an element other than Mn as the B site element is as follows.

As a Ni oxide, in the case of the $(RE_{1-z}AE_z)BO_3$ structure when n=$\infty$, $La_{1-z}Sr_zNiO_3$, $Nd_{1-z}Sr_zNiO_3$, $Sm_{1-z}Sr_zNiO_3$, $Eu_{1-z}Sr_zNiO_3$ and the like are preferable. Particularly, $Sm_{1-z}Sr_zNiO_3$, $Eu_{1-z}Sr_zNiO_3$ and the like are preferable because a metal insulator transition temperature is higher than room temperature. In addition, in the case of $(RE_{1-z}AE_z)_2BO_4$ structure when n=1, $(La_{1-z}Sr_z)_2NiO_4$ is preferable.

Furthermore, as a Fe oxide, $La_{1-z}Sr_zFeO_3$ having the $(RE_{1-z}AE_z)BO_3$ structure when n=$\infty$ is preferable.

Still furthermore, as a Cu oxide, $(La_{1-z}Ca_z)_2CuO_4$, $(La_{1-z}Sr_z)_2CuO_4$, $(La_{1-z}Ba_z)_2CuO_4$ and the like having the $(RE_{1-z}AE_z)_2BO_4$ structure when n=1 is preferable.

Figure 7:
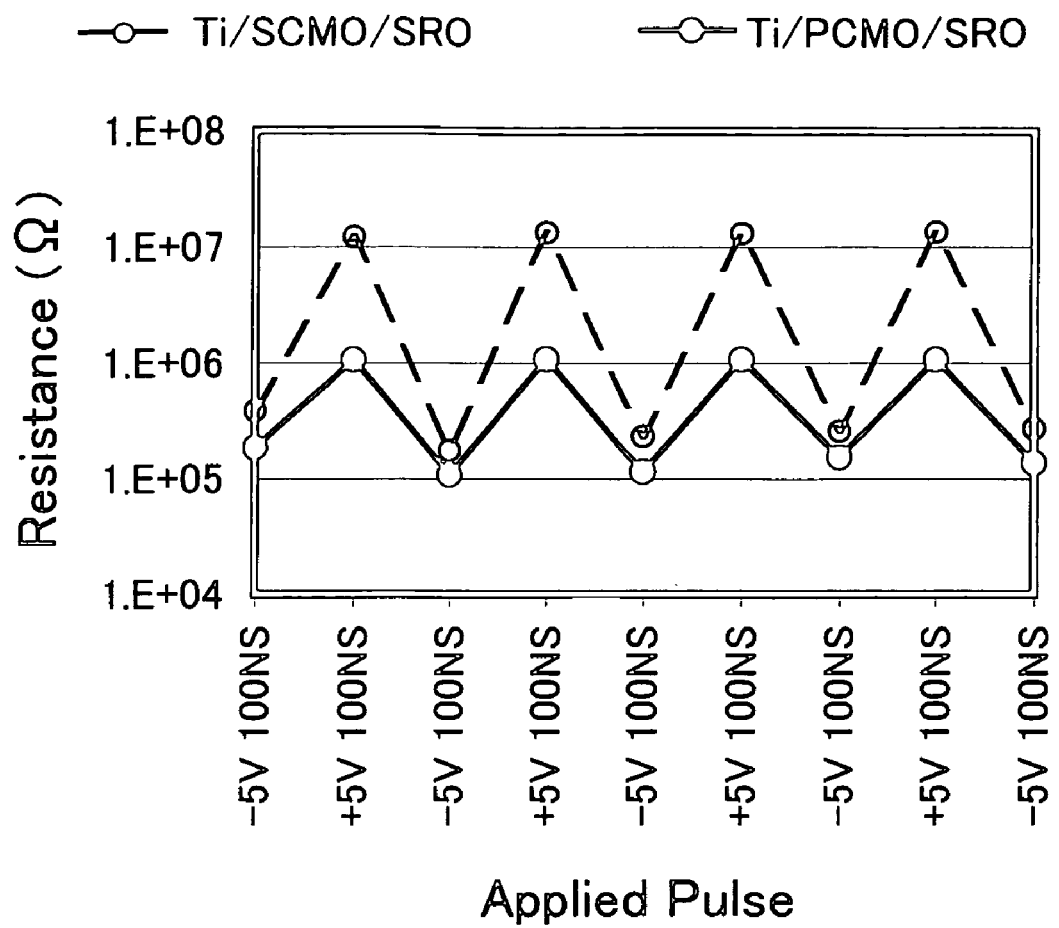
FIG. 7 is a characteristic view showing switching characteristics when $Sm_{0.7}Ca_{0.3}MnO_3$ (SCMO) and $Pr_{0.7}Ca_{0.3}MnO_3$ (PCMO) are used as the variable resistors of the variable resistor elements according to the present invention.

FIG. 7 shows switching characteristics of variable resistor element provided by forming a $Sm_{0.7}Ca_{0.3}MnO_3$ (referred to as the "SCMO") film as a variable resistor on an oxide electrode SRO serving as a lower electrode and forming a Ti film as an upper electrode (first electrode), and a variable resistor element provided by forming a $Pr_{0.7}Ca_{0.3}MnO_3$ (PCMO) film as a variable resistor on an oxide electrode SRO serving as a lower electrode and forming a Ti film as an upper electrode (first electrode).

As shown in FIG. 7, although the switching ratio (resistance ratio) is about 10 in the case of the PCMO film, the switching ratio is about 100 when the SCMO film is used as the variable resistor. When Sm is used in the A site, since the Mott gap is increased, the resistance ratio is higher than that of the case where the PCMO is used, which can be explained from the switching operation principle provided in the present invention, so that theory and the experiment data coincide with each other qualitatively.

Second Embodiment

Figure 8:
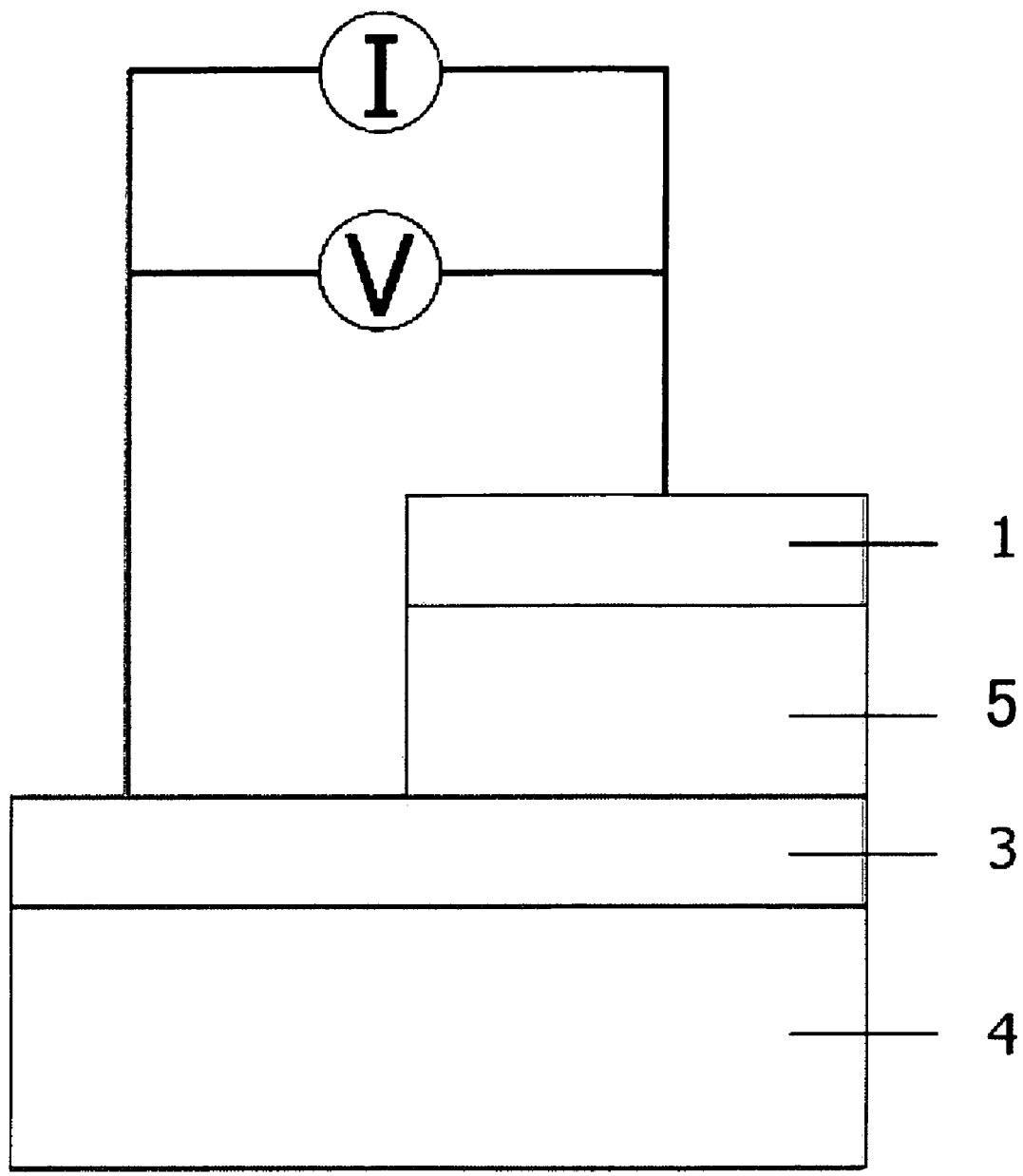
FIG. 8 is an element sectional view schematically showing a sectional structure of a variable resistor element according to the present invention in a second embodiment using a strongly-correlated material of an n-type semiconductor as a variable resistor.

FIG. 8 shows a sectional structure of an element of the present invention according to a second embodiment. The element of the present invention is provided by sequentially depositing a lower electrode 3, a variable resistor 5 formed of a strongly-correlated material of an n-type semiconductor, and an upper electrode 1 on a substrate 4. The variable resistor 2 in a metal state is sandwiched between both electrodes 1 and 3 and it is operated by applying a voltage pulse between the electrodes. The switching operation between an ON state (low resistance state) and OFF state (high resistance state) is implemented by the voltage pulse having a voltage magnitude greater than that of an absolute value of a threshold voltage as will be described below, and the resistance state of the element of the present invention is read by applying a voltage lower than the threshold voltage to use the element as a memory element. To provide different electric resistances between the ON state and OFF state, it is necessary to select an electrode material having an appropriate work function, so that the performance of the switching operation varies depending on the combination between the electrode and the variable resistor. In addition, reference characters "I" and "V" in FIG. 8 designate an ampere meter and a voltmeter used when the current/voltage characteristics of the element of the present invention are measured.

Figure 9:
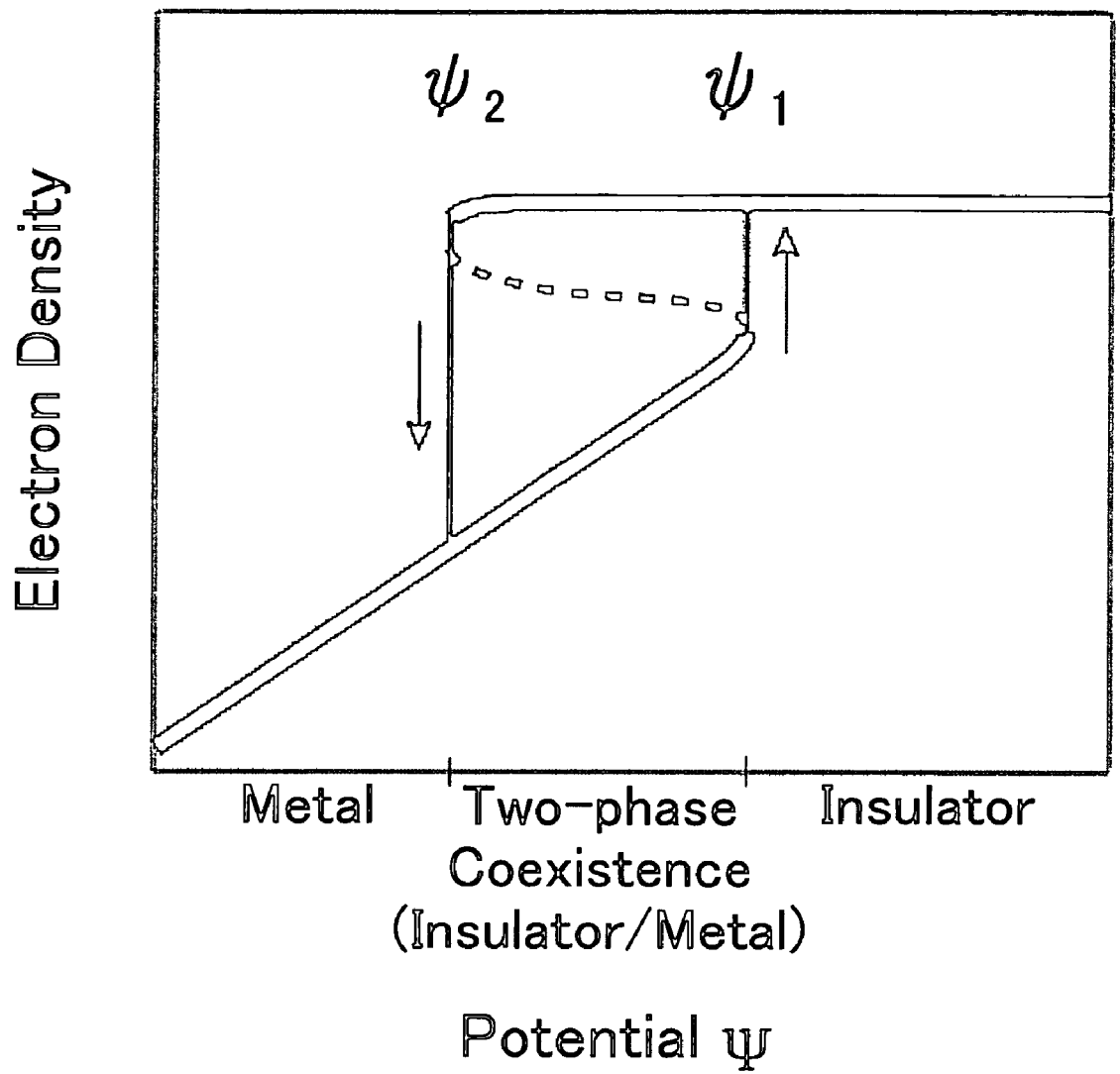
FIG. 9 is a view showing potential dependency of an electron density in the vicinity of metal-insulator transition point of the variable resistor in the second embodiment.

First, a switching operation principle will be described. As shown in a non-patent document 5, an electron density in the vicinity of the potential causing the metal insulator transition shows hysteresis with respect to a potential change as shown in FIG. 9. That is, as shown in FIG. 9, when a potential $\Psi$ is raised from a metal state, the element is transferred to an insulator at a potential $\Psi1$ while when the potential $\Psi$ is lowered from the insulator state, it is transferred to the metal state at a potential $\Psi2$. When the potential $\Psi$ is positioned between the phase transition points $\Psi1$ and $\Psi2$ ($\Psi2<\Psi<\Psi1$), two-phase coexisting phase is provided so that the electron density can be in either of the metal state or the insulator state. When this two-phase coexisting phase is implemented in the variable resistor (strongly-correlated material), and the metal (ON state) and the insulator (OFF state) are switched, the element can be functioned as a variable resistor element that can be used in a resistive nonvolatile memory (RRAM).

Figure 10:
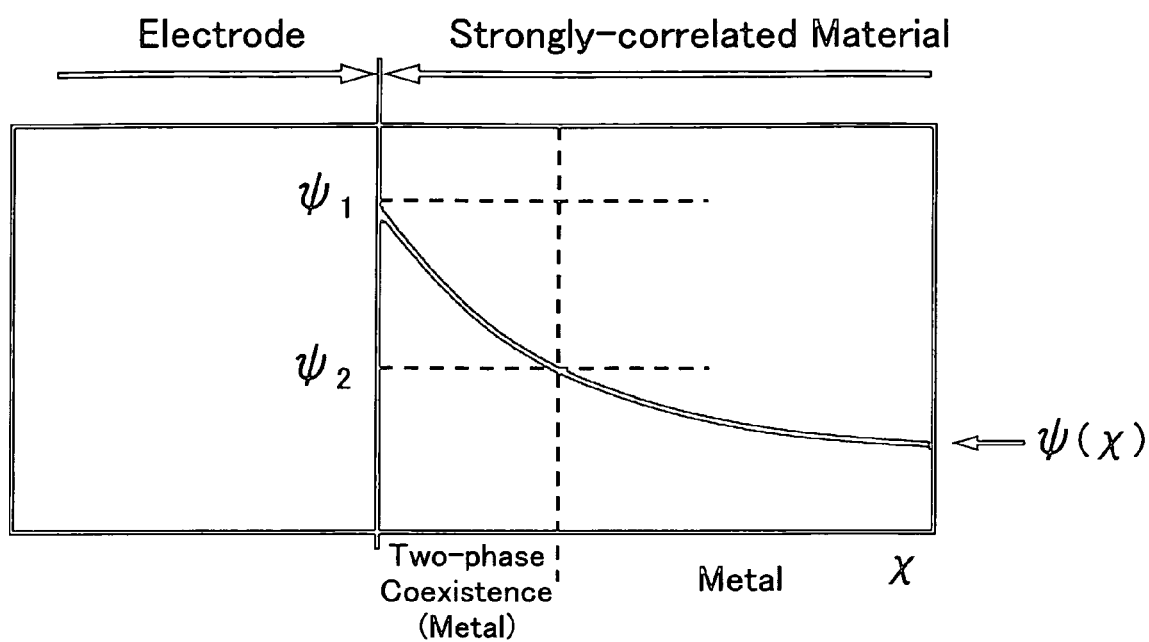
FIG. 10 is a view showing spatial dependency in the vicinity of an interface between a metal electrode and the strongly-correlated material when a two-phase coexisting phase of the variable resistor in the second embodiment is in a metal state.
Figure 11:
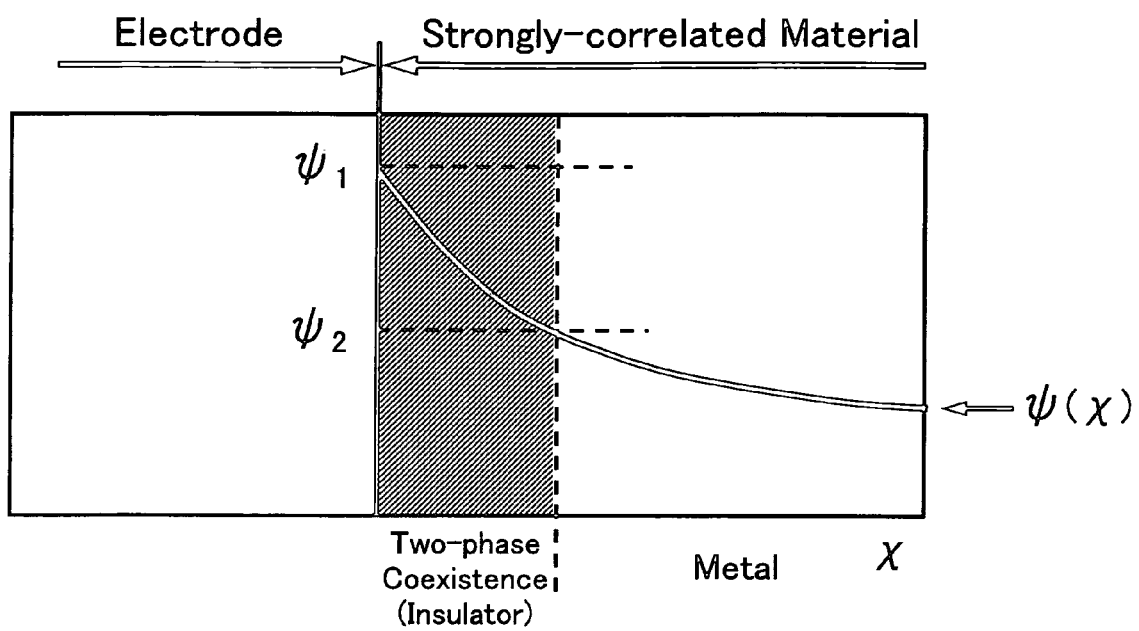
FIG. 11 is a view showing spatial dependency in the vicinity of an interface between the metal electrode and the strongly-correlated material when the two-phase coexisting phase of the variable resistor in the second embodiment is in an insulator state.

An important point in the present invention is a work function difference between either electrode material (first electrode) of the lower electrode or the upper electrode and the variable resistor and the two-phase coexisting phase is to be implemented in the variable resistor by setting an appropriate work function. When it is assumed that the potential in the variable resistor is $\Psi(x)$ (wherein x is a distance from the interface with the first electrode), the $\Psi(x)$ is spatially modified due to a charge injection effect from the electrode metal. According to the present invention, it is necessary to set a work function difference so as to satisfy $\Psi2<\Psi(0)<\Psi1$ that is the condition for the $\Psi(x)$ to cross the phase transition point. At this time, since two phase transition points $\Psi1$ and $\Psi2$ exist on both sides of the two-phase coexisting phase, the thickness of the insulator phase in the variable resistor varies depending on which point is selected. FIG. 10 shows a device in the ON state in which the two-phase coexisting phase is in the metal state, and FIG. 11 shows a device in the OFF state in which the two-phase coexisting phase is in the insulator state. When the insulator phase of the interface between the electrode and the strongly-correlated material is thick, the resistance becomes high, so the current-voltage characteristics in FIG. 10 are different from those in FIG. 11 in which two different insulator phase thicknesses are implemented.

Figure 12:
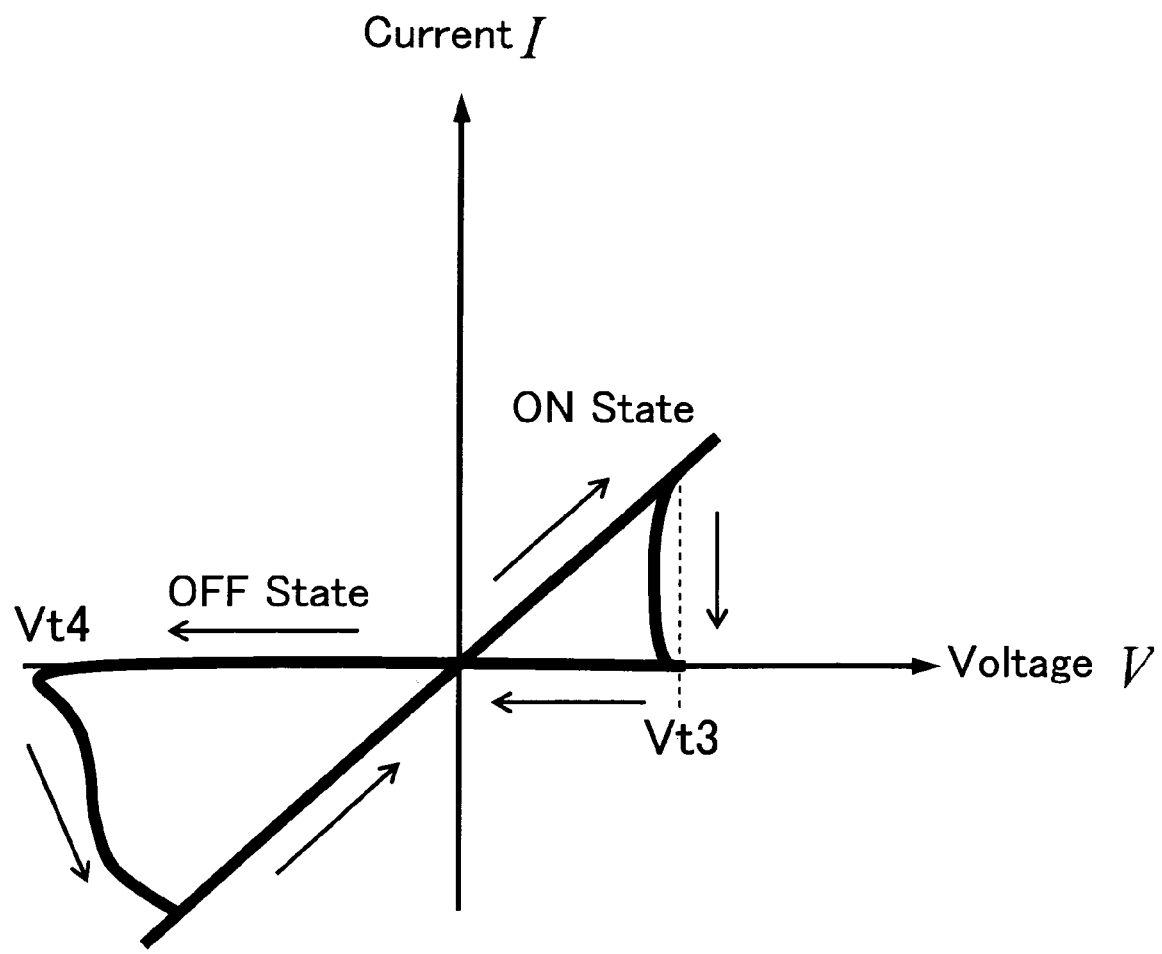
FIG. 12 is a current/voltage plot showing behavior of current/voltage characteristics in ON state and OFF state when an interface potential $\phi(0)$ between the metal electrode and the strongly-correlated material exists between transition points $\phi 1$ and $\phi 2$ in the second embodiment.

FIG. 12 shows behavior of the current-voltage characteristics in the ON state and OFF state of the element of the present invention. As shown in FIG. 12, when a positive voltage pulse having a voltage magnitude greater than an absolute value |Vt3| of the threshold voltage is applied to the element of the present invention in the ON state, the state is shifted to the OFF state, and when a negative voltage pulse having a voltage magnitude greater than an absolute value |Vt4| of the threshold voltage is applied to the element of the present invention in the OFF state, the state is shifted to the ON state.

Figure 13:
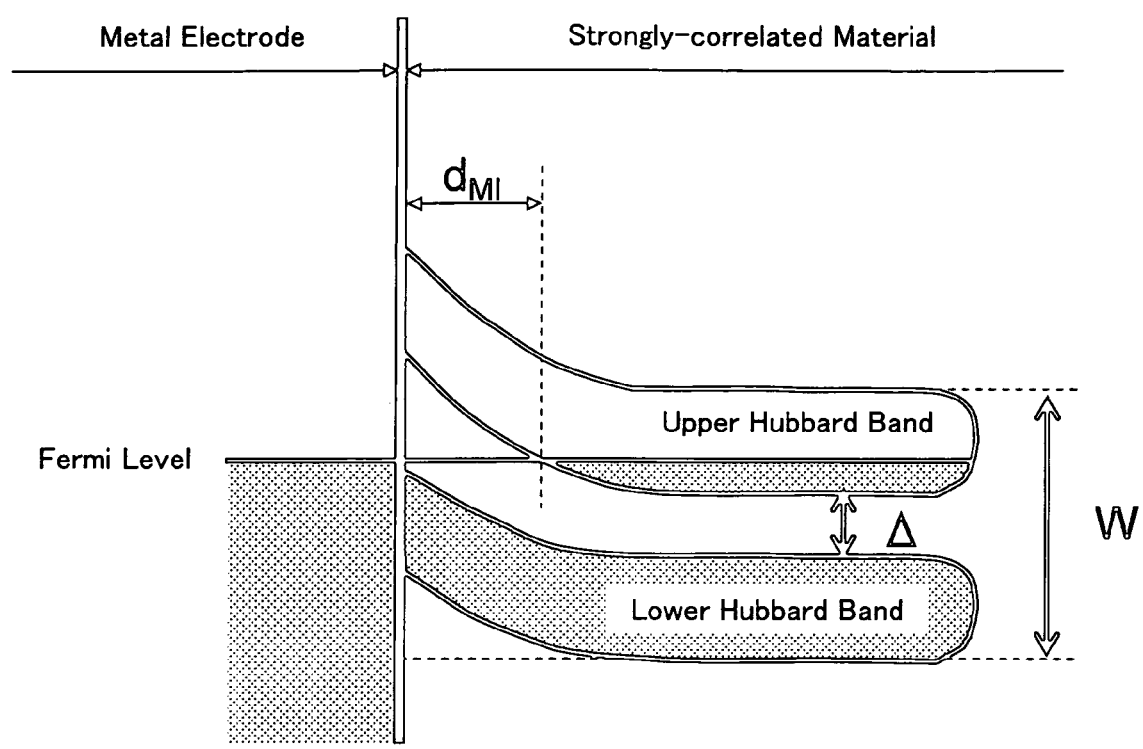
FIG. 13 is a potential conceptual view of the variable resistor element according to the present invention in the second embodiment using the strongly-correlated material of the n-type semiconductor as the variable resistor.

Next, the condition to implement the switching operation will be described. FIG. 13 is an energy band diagram showing a potential conceptual view at the interface between the metal electrode material and the strongly-correlated material in the element of the present invention. In addition, as the strongly-correlated material, an electron-doped n-type semiconductor is used. Mott metal-insulator transition phenomenon at the interface due to band bending was theoretically calculated using a density matrix renormalization group. The result can be explained by slightly expanding Poisson formula used in semiconductor hetero conjunction. Basically, forming the Mott insulator phase (two-phase coexisting phase) at the interface under zero-bias condition, that is, a condition that satisfies Mott insulator phase thickness $d_{MI}>0$ is required to explain the switching phenomenon.

Since the Mott insulator phase thickness $d_{MI}$ is expressed by the following formula 3, if a potential difference Vd defined by a difference between the work function of the electrode material and the work function of the variable resistor (strongly-correlated material) satisfies, at least, the condition expressed by the following formula 4, the Mott insulator phase thickness $d_{MI}$ becomes a positive value (real number).

$$d_{MI}=(\in(-2Vd+z(W-\Delta))/(-ez))^{1/2} \quad \text{Formula 3}$$

$$Vd>z(W-\Delta)/2 \quad \text{Formula 4}$$

In the formula 3 and formula 4, similar to the first embodiment, "z" is a doping rate, "W" is a band width of the variable resistor (refer to FIG. 13), and "$\Delta$" is a Mott gap of the variable resistor (refer to FIG. 13). In addition, in formula 3, similar to the first embodiment, "$\in$" is a dielectric constant of the variable resistor (Motto insulator phase) and "e" is an elementary charge. Here, the doping rate "z" actually corresponds to the number of conductive carriers per unit cell in the variable resistor. According to the second embodiment, since the variable resistor is the n-type semiconductor, the carrier is an electron. When a perovskite-type oxide that will be described below is used as the variable resistor, the variable resistor can be expressed by a general formula ($RE_{1-z}AE_z)_{n+1}B_nO_{3n+1}$ (wherein n=1, 2 or $\infty$, and doping rate "z" satisfies that $0\leq z\leq 1$) assuming that the doping rate "z" is a composition ratio (mol fraction) of alkaline earth metal AE substituting rare earth metal RE in a A site of the perovskite-type oxide.

Therefore, specifically, the doping rate "z", "W" and "$\Delta$" can be led from composition analysis of the variable resistor, photoelectron spectroscopic measurement of the bulk of the variable resistor, and optical spectrum (optical conductivity) of the bulk of the variable resistor, respectively.

The strongly-correlated material is likely to be used as the insulator transition phase in the present invention. The following material is desirable.

As a preferable example of the strongly-correlated material of the variable resistor in this embodiment, a perovskite-type oxide of an n-type semiconductor expressed by the structural formula (general formula) of the following chemical formula 2, or a solid solution of an n-type semiconductor comprising a combination of a plurality of different perovskite-type oxides expressed by the above structural formula is used.

$$(RE_{1-z}AE_z)_{n+1}B_nO_{3n+1} \quad \text{Chemical formula 2}$$

Here, in the above structural formula, n=1, 2 or $\infty$, and $0\leq z\leq 1$. In addition, "RE" is any one rare earth element selected from La, Pr, Nd, Sm, Eu, Gd, Tb, Dy, Ho, Er, Tm, Yb, and Lu, "AE" is any one alkaline earth element selected from Ca, Sr, and Ba, and "B" is any one element selected from Ti and V.

Specifically, according to the structural formula shown in the chemical formula 2, when n=∞, the formula is $(RE_{1-z}AE_z)BO_3$, when n=1, the formula is $(RE_{1-z}AE_z)_2BO_4$, and when n=2, the formula is $(RE_{1-z}AE_z)_3B_2O_7$.

Specifically, as a Ti oxide, $Sr_{1-z}La_zTiO_3$, $La_{1-z}Y_zTiO_3$, $Y_{1-z}Ca_zTiO_3$ and the like are preferable. In addition, as a V oxide, $La_{1-z}Ca_zVO_3$ and $La_{1-z}Sr_zVO_3$ are preferable.

Third Embodiment

According to the present invention, a strongly-correlated material of the variable resistor other than the perovskite-type oxide described in the above first and second embodiments can cause the similar resistance switching operation by introducing an oxygen defect or introducing excessive oxygen. One example thereof includes a binary oxide such as NiO and CoO in which the oxygen defect or excessive oxygen is introduced. Since the material has small number of metal elements, adjustment of composition is easy. In addition, $Fe_3O_4$ and the like are preferable. Furthermore, a material such as $VO_2$, $V_2O_3$ or Cr-doped $V_2O_3$ is also preferable. Similarly, a material such as $TiO_2$ or $Ti_nO_{2n-1}$ (n=2, 3) is preferable.

In addition, when the excessive oxygen is introduced, a hole is introduced as a carrier to be the p-type semiconductor. Thus, when a potential difference Vd defined by a difference between the work function of the electrode material and the work function of the variable resistor (strongly-correlated material) satisfies the condition expressed by the following formula 5 where a carrier concentration per unit cell is "z", a variable resistor element shows preferable switching characteristics. In addition, "W" is a band width of the variable resistor and "Δ" is a Mott gap of the variable resistor.

$Vd < -z(W-\Delta)/2$      Formula 5

As a preferable example of the variable resistor material introduced with excessive oxygen in this embodiment, a transition metal oxide (or lanthanoid metal oxide) of a p-type semiconductor expressed by the structural formula (general formula) of the following chemical formula 3 is preferable.

$M_{m(1-z)}O_n$      Chemical formula 3

Here, in the above structural formula, "m" and "n" are stoichiometric compositions determined by valence of metal (M) ion, "z" is a carrier concentration per unit cell due to introduction of excessive oxygen within a range of 0<z<1. In addition, "M" is any one element selected from transition metal having 3d-electron, 4d-electron or 5d-electron and lanthanoid metal having 4f-electron. Furthermore, "z" that is the carrier concentration per unit cell is defined by a doping rate "z" like in the perovskite-type oxide in the first embodiment.

When the oxygen defect is introduced, an electron is introduced as a carrier to be the n-type semiconductor. Thus, if a potential difference Vd defined by a difference between the work function of the electrode material and the work function of the variable resistor (strongly-correlated material) satisfies the condition expressed by the following formula 6 where a carrier concentration per unit cell is "z", a variable resistor element shows preferable switching characteristics. In addition, "W" is a band width of the variable resistor and "Δ" is a Mott gap of the variable resistor.

$Vd > z(W-\Delta)/2$      Formula 6

As a preferable example of the variable resistor material introduced with the oxygen defect in this embodiment, a transition metal oxide (or lanthanoid metal oxide) of an n-type semiconductor expressed by the structural formula (general formula) of the following chemical formula 4 is preferable.

$M_mO_{n(1-z)}$      Chemical formula 4

Here, in the above structural formula, "m" and "n" are stoichiometric composition determined by valence of metal (M) ion, "z" is a carrier concentration per unit cell due to introduction of oxygen defect within a range of 0<z<1. In addition, "M" is any one element selected from transition metal having 3d-electron, 4d-electron or 5d-electron and lanthanoid metal having 4f-electron. Furthermore, "z" that is the carrier concentration per unit cell is defined by a doping rate "z" like in the perovskite-type oxide in the second embodiment.

As a specific compound of the variable resistor material in which excessive oxygen is introduced or the variable resistor material in which the oxygen defect is introduced, $TiO_2$, $Ti_nO_{2n-1}$ (n=1, 2), $VO_2$, $V_2O_3$, Cr-doped $V_2O_3$, $V_3O_5$, $Fe_3O_4$, CoO, CuO, $Cu_2O$, $SnO_2$, ZnO, $In_2O_3$, $Tl_2O_3$, NbO, LaO, NdO, SmO, EuO, $ReO_3$, $ReO_2$, $CrO_2$, $RhO_2$, $Rh_2O_3$, $OsO_2$, $IrO_2$, $WO_2$, $MxWO_3$ (M=alkaline metal, alkaline earth metal, rare earth element), MoO2 and the like are preferable.

According to this embodiment, not only the above binary transition metal oxides but also a transition metal oxide (or lanthanoid oxide) of an n-type or a p-type semiconductor expressed by the structural formula (general formula) of the following chemical formula 5 can be a preferable variable resistor material.

$(M_{1-z}N_z)_mO_n$      Chemical formula 5

Here, in the above structural formula, "m" and "n" are stoichiometric compositions determined by valence of metal (M) ion, "z" is a doping amount of metal N having a valence different from that of M within a range of $0 \leq z \leq 1$. In addition, "M" is any one element selected from transition metal having 3d-electron, 4d-electron or 5d-electron and lanthanoid metal having 4f-electron. "N" is any one element selected from alkaline metal, alkaline earth metal, transition metal and lanthanoid metal. Furthermore, "z" that is the carrier concentration per unit cell is defined by a doping rate "z" similar to the chemical formula 3 or 4.

As specific compound expressed by the chemical formula 5, $(V_{1-z}Cr_z)_2O_3$ and $(Ti_{1-z}N_z)O_2$ (N=Nb, Fe, Ni, or Co) are preferable.

Next, another embodiment of the element of the present invention and the method of the present invention will be described.

According to the present invention, as the strongly-correlated material of the variable resistor, although an organic material such as BEDT-TTF can be used other than the above, when a long-time reliability is required, the oxide material in the above embodiments is preferable.

In addition, as the strongly-correlated material of the variable resistor, although a sulfide, such as $NiS_{2-z}Se_z$, other than the oxide can be used, the oxide material is more preferable than the sulfide from an environmental point of view.

In addition, although the perovskite-type oxide in which the A site is doped is used as the strongly-correlated material of the variable resistor, a perovskite-type oxide in which the B site is doped can cause the similar switching operation. The perovskite-type oxide in which the B site is doped can be expressed by the structural formula (general formula) of the following chemical formula 6 and a material such as $SrTi_{1-z}Nb_zO_3$ in which Ti in the B site is doped with Nb is preferable.

In addition, in the chemical structural formula 6, "A" is an alkaline earth element, and "TA" and "TB" are different transition metal elements from each other.

$$A_{n+1}(TA_{1-z}TB_z)_nO_{3n+1}, (n=1, 2 \text{ or } \infty, 0 \leq z \leq 1) \quad \text{Chemical formula 6}$$

INDUSTRIAL APPLICABILITY

The variable resistor element and its manufacturing method according to the present invention can be applied to a nonvolatile semiconductor memory device provided with a variable resistor element comprising a variable resistor between two metal electrodes and changing an electric resistance when a voltage pulse is applied between the metal electrodes.

The invention claimed is:

1. A variable resistor element, comprising:
   a variable resistor formed of a strongly-correlated material between two metal electrodes, and changing in electric resistance between the metal electrodes when a voltage pulse is applied between the metal electrodes, wherein
   metal-insulator transition is caused at an interface between a first electrode that is either one of the two metal electrodes and the variable resistor when the voltage pulse is applied, and
   work functions of the first electrode and the variable resistor are such that a two-phase coexisting phase of a metal phase and an insulator phase is formed in a vicinity of the interface between the variable resistor and the first electrode due to a difference between the work functions of the first electrode and the variable resistor.

2. The variable resistor element according to claim 1, wherein the metal-insulator transition is Mott transition.

3. The variable resistor element according to claim 1, wherein the variable resistor is a perovskite-type oxide.

4. The variable resistor element according to claim 3, wherein
   the variable resistor is a perovskite-type oxide of a p-type semiconductor or an n-type semiconductor expressed by a general formula $(RE_{1-z}AE_z)_{n+1}B_nO_{3n+1}$, wherein n=1, 2 or ∞, and doping rate z satisfies $0 \leq z \leq 1$, or a solid solution of a p-type semiconductor or an n-type semiconductor comprising a combination of a plurality of different perovskite-type oxides expressed by the above general formula,
   RE in the general formula is any one rare earth element selected from La, Pr, Nd, Sm, Eu, Gd, Tb, Dy, Ho, Er, Tm, Yb, and Lu,
   AE in the general formula is any one alkaline earth element selected from Ca, Sr, and Ba, and
   B in the general formula is any one element selected from Sc, Ti, V, Cr, Mn, Fe, Co, Ni, and Cu.

5. The variable resistor element according to claim 1, wherein
   the variable resistor is a transition metal oxide or lanthanoid metal oxide.

6. The variable resistor element according to claim 1, wherein
   a potential difference Vd defined by a work function difference between the first electrode and the variable resistor of a p-type semiconductor satisfies the following inequality $$Vd < -z(W-\Delta)/2$$

wherein a doping rate of the variable resistor is z, a band width of the variable resistor is W, and Mott gap of the variable resistor is Δ.

7. The variable resistor element according to claim 1, wherein
   a potential difference Vd defined by a work function difference between the first electrode and the variable resistor of an n-type semiconductor satisfies the following inequality $$Vd > z(W-\Delta)/2$$

wherein a doping rate of the variable resistor is z, a band width of the variable resistor is W, and Mott gap of the variable resistor is Δ.

8. A method of manufacturing a variable resistor element, the method comprising:
   providing a variable resistor formed of a strongly-correlated material between two metal electrodes, the variable resistor element having characteristics such that, when a voltage pulse is applied between the metal electrodes, metal-insulator transition is generated at an interface between a first electrode that is either one of the two metal electrodes and the variable resistor, and an electric resistance between the metal electrodes changes; and
   selecting the first electrode and the variable resistor such that a difference in work functions between the first electrode and the variable resistor is sufficient to form a two-phase coexisting phase between a metal phase and an insulator phase in a vicinity of an interface between the variable resistor and the first electrode.

9. The manufacturing method of the variable resistor element according to claim 8, wherein the variable resistor is a perovskite-type oxide.

10. The manufacturing method of the variable resistor element according to claim 9, wherein
    the variable resistor is a perovskite-type oxide of a p-type semiconductor or an n-type semiconductor expressed by a general formula $(RE_{1-z}AE_z)_{n+1}B_nO_{3n-1}$, wherein n=1, 2 or ∞, and doping rate z satisfies $0 \leq z \leq 1$, or a solid solution of a p-type semiconductor or an n-type semiconductor comprising a combination of a plurality of different perovskite-type oxides expressed by the above general formula,
    RE in the general formula is any one rare earth element selected from La, Pr, Nd, Sm, Eu, Gd, Tb, Dy, Ho, Er, Tm, Yb, and Lu,
    AE in the general formula is any one alkaline earth element selected from Ca, Sr, and Ba, and
    B in the general formula is any one element selected from Sc, Ti, V, Cr, Mn, Fe, Co, Ni, and Cu.

11. The manufacturing method of the variable resistor element according to claim 8, wherein the variable resistor is a transition metal oxide or lanthanoid metal oxide.

12. The manufacturing method of the variable resistor element according to claim 8, wherein
    the first electrode and the variable resistor are selected so that a potential difference Vd defined by the work function difference between the first electrode and the variable resistor of a p-type semiconductor satisfies the following inequality $$Vd < -z(W-\Delta)/2$$

wherein a doping rate of the variable resistor is z, a band width of the variable resistor is W, and Mott gap of the variable resistor is Δ.

13. The manufacturing method of the variable resistor element according to claim 8, wherein
    the first electrode and the variable resistor are set so that a potential difference Vd defined by a work function difference between the first electrode and the variable resistor of an n-type semiconductor satisfies the following inequality $$Vd > z(W-\Delta)/2$$

wherein a doping rate of the variable resistor is z, a band width of the variable resistor is W, and Mott gap of the variable resistor is Δ.

14. A variable resistor element, comprising:
a variable resistor formed of a strongly-correlated material between two metal electrodes, and changing in electric resistance between the metal electrodes when a voltage pulse is applied between the metal electrodes, wherein
metal-insulator transition is caused at an interface between a first electrode that is either one of the two metal electrodes and the variable resistor when the voltage pulse is applied,
the variable resistor is a transition metal oxide or lanthanoid metal oxide, and
the variable resistor is a metal oxide of a p-type semiconductor expressed by a general formula $M_{m(1-z)}O_n$, wherein m and n are stoichiometric compositions determined by a valence of metal M ion and z is a carrier concentration per unit cell due to introduction of excessive oxygen within a range of 0<z<1, or an n-type semiconductor expressed by a general formula $M_mO_{n(1-z)}$, wherein m and n are stoichiometric compositions determined by a valence of metal M ion and z is a carrier concentration per unit cell due to the introduction of oxygen defect within a range of 0<z<1, and M in the general formula is any one element selected from transition metal having 3d-electron, 4d-electron or 5d-electron and lanthanoid metal having 4f-electron.

15. The variable resistor element according to claim 14, wherein a work function difference between the first electrode and the variable resistor is a work function difference capable of forming a two-phase coexisting phase of a metal phase and an insulator phase in a vicinity of the interface between the variable resistor and the first electrode.

16. The variable resistor element according to claim 14, wherein the metal-insulator transition is Mott transition.

17. The variable resistor element according to claim 14, wherein
a potential difference Vd defined by a work function difference between the first electrode and the variable resistor of a p-type semiconductor satisfies the following inequality $$Vd < -z(W-\Delta)/2$$

wherein a doping rate of the variable resistor is z, a band width of the variable resistor is W, and Mott gap of the variable resistor is Δ.

18. The variable resistor element according to claim 14, wherein
a potential difference Vd defined by a work function difference between the first electrode and the variable resistor of an n-type semiconductor satisfies the following inequality $$Vd > z(W-\Delta)/2$$

wherein a doping rate of the variable resistor is z, a band width of the variable resistor is W, and Mott gap of the variable resistor is Δ.

19. A variable resistor element, comprising:
a variable resistor formed of a strongly-correlated material between two metal electrodes, the variable resistor arranged to change electric resistance between the metal electrodes when a voltage pulse is applied between the metal electrodes, wherein
a metal-insulator transition is caused at an interface between a first electrode that is either one of the two metal electrodes and the variable resistor when the voltage pulse is applied,
the variable resistor is a transition metal oxide or lanthanoid metal oxide, and
the variable resistor is a metal oxide expressed by $(M_{1-z}N)_mO_n$, wherein m and n are stoichiometric compositions determined by a valence of metal M ion and z is a doping amount of metal N, wherein N is alkaline metal, alkaline earth metal, transition metal, or lanthanoid metal, having a valence different from that of the metal M within a range of $0 \leq z \leq 1$, and M in the general formula is any one element selected from transition metal having 3d-electron, 4d-electron or 5d-electron and lanthanoid metal having 4f-electron.

20. The variable resistor element according to claim 19, wherein a work function difference between the first electrode and the variable resistor is a work function difference capable of forming a two-phase coexisting phase of a metal phase and an insulator phase in a vicinity of the interface between the variable resistor and the first electrode.

21. The variable resistor element according to claim 19, wherein the metal-insulator transition is Mott transition.

22. The variable resistor element according to claim 19, wherein
a potential difference Vd defined by a work function difference between the first electrode and the variable resistor of a p-type semiconductor satisfies the following inequality $$Vd < -z(W-\Delta)/2$$

wherein a doping rate of the variable resistor is z, a band width of the variable resistor is W, and Mott gap of the variable resistor is Δ.

23. The variable resistor element according to claim 19, wherein
a potential difference Vd defined by a work function difference between the first electrode and the variable resistor of an n-type semiconductor satisfies the following inequality $$Vd > z(W-\Delta)/2$$

wherein a doping rate of the variable resistor is z, a band width of the variable resistor is W, and Mott gap of the variable resistor is Δ.

24. A method of manufacturing a variable resistor element, the method comprising:
providing a variable resistor formed of a strongly-correlated material between two metal electrodes, wherein
the variable resistor element has characteristics such that, when a voltage pulse is applied between the metal electrodes, metal-insulator transition is generated at an interface between a first electrode that is either one of the two metal electrodes and the variable resistor, and an electric resistance between the metal electrodes changes, and
the first electrode and the variable resistor are set so that a work function difference between the first electrode and the variable resistor becomes a work function difference capable of forming a two-phase coexisting phase between a metal phase and an insulator phase in a vicinity of an interface between the variable resistor and the first electrode, the variable resistor is a transition metal oxide or lanthanoid metal oxide, and the variable resistor is a metal oxide of a p-type semiconductor expressed by a general formula $M_{m(1-z)}O_n$, wherein m and n are stoichiometric compositions determined by a valence of metal M ion and z is a carrier concentration per unit cell due to introduction of excessive oxygen within a range of $0<z<1$, or an n-type semiconductor expressed by a general formula $M_mO_{n(1-z)}$, wherein m and n are stoichiometric compositions determined by a valence of metal M ion and z is a carrier concentration per unit cell due to introduction of oxygen defect within a range of $0<z<1$, and M in the general formula is any one element selected from transition metal having 3d-electron, 4d-electron or 5d-electron and lanthanoid metal having 4f-electron.

25. The manufacturing method of the variable resistor element according to claim 24, wherein the first electrode and the variable resistor are set so that a potential difference Vd defined by a work function difference between the first electrode and the variable resistor of a p-type semiconductor satisfies the following inequality $Vd<-z(W-\Delta)/2$ wherein a doping rate of the variable resistor is z, a band width of the variable resistor is W, and Mott gap of the variable resistor is $\Delta$.

26. The manufacturing method of the variable resistor element according to claim 24, wherein the first electrode and the variable resistor are set so that a potential difference Vd defined by a work function difference between the first electrode and the variable resistor of an n-type semiconductor satisfies the following inequality $Vd>z(W-\Delta)/2$ wherein a doping rate of the variable resistor is z, a band width of the variable resistor is W, and Mott gap of the variable resistor is $\Delta$.

27. A method of manufacturing a variable resistor element, the method comprising:

providing a variable resistor formed of a strongly-correlated material between two metal electrodes, wherein the variable resistor element has characteristics such that, when a voltage pulse is applied between the metal electrodes, metal-insulator transition is generated at an interface between a first electrode that is either one of the two metal electrodes and the variable resistor, and an electric resistance between the metal electrodes changes, and the first electrode and the variable resistor are set so that a work function difference between the first electrode and the variable resistor becomes a work function difference capable of forming a two-phase coexisting phase between a metal phase and an insulator phase in a vicinity of an interface between the variable resistor and the first electrode, the variable resistor is a transition metal oxide or lanthanoid metal oxide and the variable resistor is a metal oxide expressed by $(M_{1-z}N_z)_mO_n$, wherein n and n are stoichiometric compositions determined by a valence of metal M ion and z is a doping amount of metal N, wherein N is alkaline metal, alkaline earth metal, transition metal, or lanthanoid metal, having a valence different from that of the metal M within a range of $0 \leqq z \leqq 1$, and M in the general formula is any one element selected from transition metal having 3d-electron, 4d-electron or 5d-electron and lanthanoid metal having 4f-electron.

28. The manufacturing method of the variable resistor element according to claim 27, wherein the first electrode and the variable resistor are set so that a potential difference Vd defined by a work function difference between the first electrode and the variable resistor of a p-type semiconductor satisfies the following inequality $Vd<-z(W-\Delta)/2$ wherein a doping rate of the variable resistor is z, a band width of the variable resistor is W, and Mott gap of the variable resistor is $\Delta$.

29. The manufacturing method of the variable resistor element according to claim 27, wherein the first electrode and the variable resistor are set so that a potential difference Vd defined by a work function difference between the first electrode and the variable resistor of an n-type semiconductor satisfies the following inequality $Vd>z(W-\Delta)/2$ wherein a doping rate of the variable resistor is z, a band width of the variable resistor is W, and Mott gap of the variable resistor is $\Delta$.

30. The manufacturing method of the variable resistor element according to claim 8, further comprising setting a concentration of carriers of the strongly correlated material based on the work functions of the first electrode and the strongly correlated material.

31. The manufacturing method of the variable resistor element according to claim 30, further comprising setting the concentration of carriers of the strongly correlated material also based on a Mott gap of the strongly correlated material.

* * * * *

UNITED STATES PATENT AND TRADEMARK OFFICE
CERTIFICATE OF CORRECTION

PATENT NO. : 7,978,047 B2
APPLICATION NO. : 11/990774
DATED : July 12, 2011
INVENTOR(S) : Yasunari Hosoi et al.

It is certified that error appears in the above-identified patent and that said Letters Patent is hereby corrected as shown below:

ON THE TITLE PAGE:
Item (73) - Assignees; should read:

(73) - Assignee: Sharp Kabushiki Kaisha, Osaka (JP);
National Institute of Advanced Industrial Science and Technology, Tokyo (JP).

Signed and Sealed this
Twenty-eighth Day of February, 2012

David J. Kappos
*Director of the United States Patent and Trademark Office*